(12) United States Patent
Mattersteig et al.

(10) Patent No.: US 12,284,906 B2
(45) Date of Patent: Apr. 22, 2025

(54) POLYPHENOLS AND POLYAMINO DERIVATIVES IN ORGANIC OPTOELECTRONIC COMPONENTS

(71) Applicant: Heliatek GmbH, Dresden (DE)

(72) Inventors: Gunter Mattersteig, Ulm (DE); Marieta Levichkova, Dresden (DE); Karsten Walzer, Dresden (DE); Martin Pfeiffer-Jacob, Dresden (DE); Daniel D'Souza, Dresden (DE); Olga Gerdes, Ulm (DE); Dirk Hildebrandt, Ulm (DE); Antoine Mirloup, Ulm (DE); Andre Weiss, Dresden (DE)

(73) Assignee: HELIATEK GMBH, Dresden (DE)

( * ) Notice: Subject to any disclaimer, the term of this patent is extended or adjusted under 35 U.S.C. 154(b) by 649 days.

(21) Appl. No.: 16/618,482

(22) PCT Filed: May 31, 2018

(86) PCT No.: PCT/EP2018/064391
§ 371 (c)(1),
(2) Date: Dec. 2, 2019

(87) PCT Pub. No.: WO2018/220148
PCT Pub. Date: Dec. 6, 2018

(65) Prior Publication Data
US 2020/0381627 A1 Dec. 3, 2020

(30) Foreign Application Priority Data

May 31, 2017 (EP) .................................. 17173859

(51) Int. Cl.
*H10K 85/60* (2023.01)
*H10K 30/30* (2023.01)
*H10K 85/20* (2023.01)

(52) U.S. Cl.
CPC ......... *H10K 85/615* (2023.02); *H10K 30/353* (2023.02); *H10K 85/622* (2023.02); *H10K 85/624* (2023.02); *H10K 85/657* (2023.02); *H10K 85/6574* (2023.02); *H10K 30/30* (2023.02); *H10K 85/211* (2023.02); *H10K 85/654* (2023.02)

(58) Field of Classification Search
CPC .......................... H01L 51/0052; H10K 85/615
See application file for complete search history.

(56) References Cited

U.S. PATENT DOCUMENTS

2002/0098346 A1  7/2002  Yitzchaik
2005/0224905 A1* 10/2005  Forrest ................... H10K 30/30
                                                  438/48

(Continued)

FOREIGN PATENT DOCUMENTS

KR      20150137730 A    12/2015
WO   WO 2004083958 A2    9/2004

(Continued)

OTHER PUBLICATIONS

Thekinneydath et al., "Molecular orbital evaluation of charge flow dynamics in natural pigments based photosensitizers", Journal of Molecular Modeling 16 (2010) 523-533, Aug. 11, 2009, Springer-Verlag, Germany.

(Continued)

*Primary Examiner* — William D Young
(74) *Attorney, Agent, or Firm* — LEYDIG, VOIT & MAYER, LTD.

(57) ABSTRACT

The invention describes the use of polyphenols and polyamino derivatives adjacent to absorber layers on the basis of small molecules in organic optoelectronic components.

12 Claims, 8 Drawing Sheets

(56) References Cited

U.S. PATENT DOCUMENTS

| | | |
|---|---|---|
| 2007/0090371 A1 | 4/2007 | Drechsel et al. |
| 2009/0056793 A1* | 3/2009 | Langhals .................. C09B 5/62 546/26 |
| 2009/0159120 A1 | 6/2009 | Wang et al. |
| 2009/0217980 A1* | 9/2009 | Pfeiffer .................. B82Y 10/00 136/263 |
| 2012/0216870 A1* | 8/2012 | So ........................ H01L 51/4273 136/263 |
| 2013/0104968 A1 | 5/2013 | Pfeiffer et al. |
| 2013/0167930 A1 | 7/2013 | Hildebrandt et al. |

FOREIGN PATENT DOCUMENTS

| | | |
|---|---|---|
| WO | WO 2006092134 A1 | 9/2006 |
| WO | WO 2010044122 A1 | 4/2010 |
| WO | WO 2011025567 A2 | 3/2011 |
| WO | WO 2011138021 A2 | 11/2011 |
| WO | WO 2011161262 A1 | 12/2011 |
| WO | WO 2014128277 A1 | 8/2014 |

OTHER PUBLICATIONS

Ramamoorthy Raja et al. "Betalain and anthocyanin dye-sensitized solar cells", Journal of Applied Electrochemistry, vol. 46, No. 9, Jun. 4, 2016 (Jun. 4, 2016), pp. 929-941, XP036025416.

Kumara G R A et al. "Shiso leaf pigments for dye-sensitized solid-state solar cell" Solar Energy Materials and Solar Cells, vol. 90, No. 9, May 23, 2006 (May 23, 2006), pp. 1220-1226, XP028002186.

Laily A R N et al. "Poly (3-Dodecylthiophene)/Natural dye bulk heterojunction organic solar cell: an electrical conductivity, and Hall Effect Study", Procedia Chemistry, vol. 19, Mar. 24, 2016 (Mar. 24, 2016), pp. 2-9, XP029471411.

* cited by examiner

POLYPHENOLS AND POLYAMINO DERIVATIVES IN ORGANIC OPTOELECTRONIC COMPONENTS

CROSS-REFERENCE TO PRIOR APPLICATIONS

This application is a U.S. National Stage Application under 35 U.S.C. § 371 of International Application No. PCT/EP2018/064391 filed on May 31, 2018, and claims benefit to European Patent Application No. EP 17173859.4 filed on May 31, 2017. The International Application was published in German on Dec. 6, 2018 as WO 2018/220148 A1 under PCT Article 21(2).

FIELD

The invention describes optoelectronic components, especially organic optoelectronic components, with polyphenols and Polyamino derivatives.

BACKGROUND

Organic optoelectronic components make it possible, for example, as a solar cell using the photoelectric effect to convert light into electricity. For the conversion of organic semiconductor materials are needed, which have sufficiently good absorption properties. These absorber materials are preferably small organic molecules, the optical and electronic properties of which strongly depend on the orientation of these depend on molecules.

To produce efficient organic photoactive devices, these often consist of several stacked cells in a tandem or multilayer structure between two electrodes, wherein the photoactive layers, this means the layers of a cell, which absorb light and contribute to the generation of electricity, can also consist of several layers. The organic optoelectronic device, in a cell next to the photoactive layers, for example, still doped and undoped charge carrier transport layers, and/or passivation layers. As photoactive materials can be used donor and acceptor materials based on small molecules. The present inventors understand as absorber materials from the base of small molecules oligomers. These oligomers are preferably acceptor-donor-acceptor or donor-acceptor-donor oligomers having at least one extended donor or extended acceptor block. This absorber materials comprise a well-defined number of monomers, typically less than ten, have a well-defined mass, typically less than 1500 g/mol, preferably less than 1200 g/mol, and are free of undefined, possibly reactive, end-of-the-chain groups as a by-product of a polymerization chain reaction may be present in polymers. Advantages of these absorber materials on the basis of small molecules are a vaporizability in vacuum and thus an associated possibility of cleaning by gradient sublimation. This makes it possible to produce arbitrarily complex multilayer systems by sequential evaporation of different and pure materials. These absorber materials continue to allow photoactive heterojunctions, cf. WO 2006 092 134. A photoactive layer in a photoactive layer stack of a cell may comprise only one acceptor or only one donor absorber material or may comprise a combination of several absorber materials of different types. Furthermore, the absorber layers materials are added to improve the absorption properties. Absorber materials based on small molecules are described, for example, in WO 2006 092 134, WO 2011 161 262 or WO 2014 128 277. Organic optoelectronic components are disclosed, for example, in WO 2004 083 958 or WO 2011 138 021.

Particularly strong light absorption is achieved when the molecular transition dipole moments of the absorber molecules are arranged orthogonal to the incident light wave. In addition to the light absorption, the charge carrier absorption from the absorber molecule into the adjacent layers towards the electrodes is also important. This becomes particularly large when the pi-electron systems present in the absorbers overlap with the pi-electron systems of the underlying layer. We call this arrangement "face-on". This arrangement is preferred. In contrast, the arrangement termed "edge-on" in which the molecular dipole is orthogonal to the incident light wave as well as "face-on", however, has the pi-electron systems of the absorber orthogonal to the underlying layer are, which suppresses an effective charge transfer between the pi-electron systems. The growth of the absorber materials on substrates or other layers is determined by intermolecular forces which, on the one hand, determine the direction of growth and the orientation of the adjacent molecules to one another. For this purpose, it is possible to insert an orientation-forming layer, which is also referred to as a template layer.

The present inventors have found that single absorber materials, predominantly donor materials, may have problems with face-on alignment, i.e., an orientation orthogonal to the incident lightwave. Such donor materials include, for example, heterocyclic rings, such as phthalocyanines, thiophene, furan and/or pyrrole rings, and are preferably acceptor donor acceptor compounds as they are for example, in WO 2006 092 134 are disclosed. Due to the often not "face-on" growing orientation of the absorber materials, no optimal use of these absorber materials is achieved in the solar cell produced with these materials.

WO 2011 025 567 discloses organic optoelectronic components which consist of a structure-forming layer on an electrode layer on which a photoactive layer system of acceptor and donor molecules is then applied, so that an ordered molecular orientation of the acceptor or donor material takes place through the adjacent structure-forming layer. WO 2011 025 567 proposes as structure-forming materials acenes, perylenes, for example diindenoperylenes (DIP) or 3, 4, 9, 1-O-perylene-tetracarboxylic acid dianhydrides (PTCDA), polyphenylenes, or coronene.

US 2002 098 346 discloses multilayer structures on a substrate, wherein a first monomolecular layer contains a first pattern-forming material and defines the orientation direction of that layer, wherein a chemically reactive monomer leads to a directed chemical reaction on the surface and thus achieves an ordered molecular structure. This is US 2002 098 346 in his applicability limited to substances that can react chemically. It is not applicable to pure physisorption without chemical reaction. WO 2010 044 122 discloses organic solar cells based on dyes which cause a photoelectrochemical reaction.

Ramaoorthy, R. et al.: Betalain and anthocyanin dye-sentizized solar cells. J. Appl. Electrochemica. (2016) 46-929-941.] And [Kumara G.R.A. among others: Shiso leaf pigments for dye-sensitized solid-state solar cells. Solar Energy materials & Solar cells 90 (2006) 1220-1226.] also disclose natural dyes dye solar cells in which, for example, a $TiO_2$-layer is immersed in the dye solution. They reveal that the natural dyes in combination with $TiO_2$ absorb light.

SUMMARY

An organic optoelectronic component has two electrodes and, arranged therebetween, at least one photoactive layer system. The photoactive layer system has at least one photoactive layer, which has absorber materials based on small molecules. The photoactive layer can be adjacent to a template layer. The template layer has as a structure:

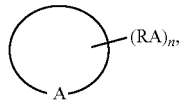

The photoactive layer may alternatively or in addition be coated together with compounds of structure (I). Here, A symbolizes a residue of a cycle which forms all or partly a carbocyclic or heterocyclic aromatic, monocyclic or polycyclic system. The cycle has at least n>1 radicals RA, and the radicals RAs are each independently selected from hydroxy and amino groups.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
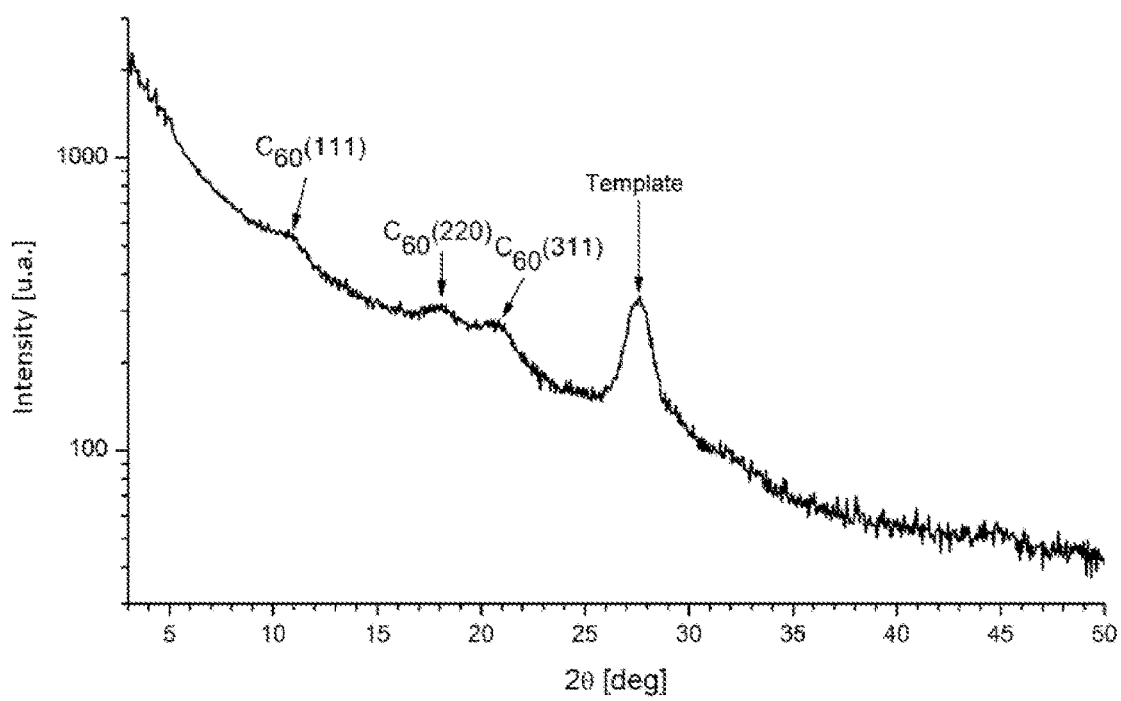
FIG. 1 is an X-ray diffractogram of a template layer.

The present invention provides materials that contribute to an improved orientation of the absorbent molecules based on small molecules in the photoactive layer, also as absorber layer called lead, thereby increasing the allow short-circuit current, the open-circuit voltage of the optoelectronic device is at least not reduced.

Embodiments of the present invention solve above-described technical problems by the use of Polyphenols and/or polyamino aromatics or heteroaromatics, which are adjacent to absorber materials, in organic optoelectronic devices, so that a better face-on growth of absorber materials is achieved.

Due to the limitation of US 2002 098 346 in its applicability to substances that can react chemically, it is not applicable to pure physisorption without chemical reaction, which present invention is based. A face-on is the case in which the pi-electron systems of the materials of the polyphenol layer and/or polyamino derivative layer used form a pi-pi overlap with the pi-electron system (s) of the subsequent absorber layer.

The technical problem is solved with optoelectronic components comprising compounds of structure (I), which adjoin absorber materials:

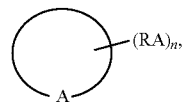

Structure (I)

wherein A symbolizes the residue of a cycle, all or partially a carbocyclic or heterocyclic forms an aromatic, monocyclic or polycyclic system, wherein this cycle comprises at least n>1 radicals RA, and these radicals RA are each independently selected from hydroxy and amino groups.

According to an embodiment of the invention, preference is given to using compounds whose radicals RA are selected from hydroxyl groups in the organic optoelectronic components.

The present inventors understand the inventively used compounds preferably compounds of general structure II:

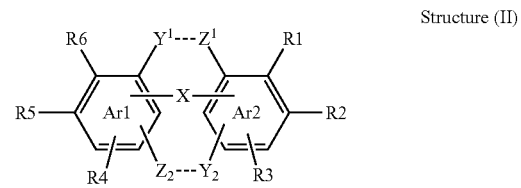

Structure (II)

the two or more connected aromatic or heteroaromatic rings (Ar1, Ar2), preferably benzene rings, each having at least two hydroxyl groups and/or amino groups, wherein the aromatic rings (Ar1, Ar2) by both a single bond (—X—) can be linked as well as directly annealed, R1 to R6 are selected from H, OH, NH2;
Y1 is selected from CH, CH2, CO;
Y2 is selected from CH, CH2, CO, H;
Z1 is selected from CH, CH2, CO, O, NH;
Z2 is selected from CH, CH2, CO, O, NH, H;
wherein the links Y1 ... Z1 and/or Y2 ... Z2 can be both covalent and non-covalent, where in the first (covalent) case Y1 ... Z1 and/or Y2 ... Z2 can also form a substituted aromatic or heteroaromatic mono-, di-tri-hydroxy compound.

The fused structures are preferably substituted naphthalene derivatives (II.1) and anthracene derivatives (II.2), which may be both bridged and unbridged. If YI, ZI or RI with I>1 are not explicitly assigned to a position, the substituents can be arranged anywhere in the assigned ring:

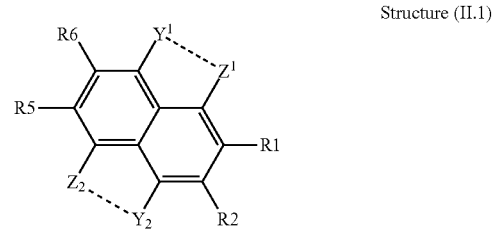

Structure (II.1)

-continued

Structure (II.2)

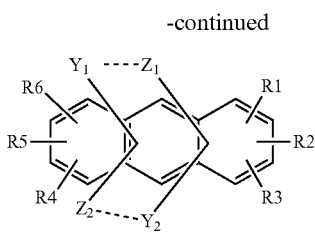

wherein R1 to R6 are selected from H, OH, NH2;
Y1 is selected from CH, CH2, CO;
Y2 is selected from CH, CH2, CO, H;
Z1 is selected from CH, CH2, CO, O, NH;
Z2 is selected from CH, CH2, CO, O, NH, H;
Wherein the links Y1 . . . Z1 and/or Y2 . . . Z2 can be both covalent and non-covalent, where in the first (covalent) case Y1 . . . Z2 and/or Y2 . . . Z2 can also form a substituted aromatic or heteroaromatic mono-, di-tri-hydroxy compound.

The bridging of the aromatic rings (Ar1 and Ar2) according to structure (II), which are linked by a single bond (—X—), can be independent
by one or two double bonds with the formation of a phenanthrene or pyrene,
by one or more fused aromatic or heteroaromatic rings to form a triphenylene or dibenzopyrene,
by alkyl groups having one to three carbon atoms,
by aryloxy or arylamino groups
by alkoxy groups to form pyrans, by carbonyl, carboxy or carbamoyl groups to form ketones, Quinones, anthraquinones (II.3), lactones and lactams, respectively.

Structure (II.3)

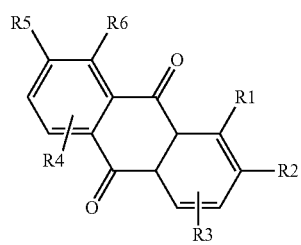

Structure (II.4)

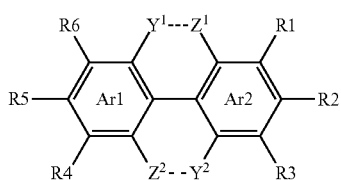

wherein Ar1 and Ar2 are two or more connected aromatic or heteroaromatic rings (Ar1, Ar2), preferably benzene rings, which each comprise at least two hydroxyl groups and/or amino groups,
R1 to R6 are selected from H, OH, H2;
Y1 is selected from CH, CH2, CO;
Y2 is selected from CH, CH2, CO, H;
Z1 is selected from CH, CH2, CO, O, NH;
Z2 is selected from CH, CH2, CO, O, NH, H;
wherein the links Y1 . . . ZI and/or Y2 . . . Z2 can be both covalent and non-covalent, with in the first (covalent) case Y1 . . . Z1 and/or Y2 . . . Z2 can also form a substituted aromatic or heteroaromatic mono-, di-tri-hydroxy compound.

Among preferred compounds based on polyphenols according to the invention are in particular compounds of the general structure (II.4) understood, more preferably ellagic acid.

The compounds based on polyamino derivatives used according to embodiments of the present invention are understood in particular as meaning the following compounds:

Polyamino aromatics or heteroaromatics described by the general structure (I) where A symbolizes the residue of a cycle which is all or part of a carbocyclic or heterocyclic aromatic, monocyclic or polycyclic system, and wherein this cycle comprises at least 2 amino groups.

Likewise, a technical problem is solved by the addition of the compounds proposed by the invention as additives to an absorber layer comprising an absorbent material based on small molecules.

As a further solution to an above-described technical problem, the production of optoelectronic components comprising one of the compounds of polyphenols and/or polyamino-aromatics or -heteroaromatics, which adjoin absorber materials based on small molecules.

By using structures according to embodiments of the invention as a template layer, there is a better alignment of the adjacent, applied after the template layer absorber material, so that a better efficiency of the optoelectronic device is achieved.

For multi-layer OPV (OPV=organic photovoltaics), a face-on orientation of the molecules is achieved, which ensures optimal light absorption and improved charge transport properties. In OPV devices, the generation of a crystalline order can lead to an increase in the short circuit current (Isc) and the open circuit voltage (Voc). Thus, by controlling the molecular crystalline orientation of the absorber layers, especially the donor layer, can be achieved an optimization of the frontier orbital levels, the absorption coefficient, the morphology and the exciton diffusion lengths. This improves the efficiency of energy conversion. A pi-stack arrangement of coplanar, flat-lying absorber molecules, which continues over several layers (face-on growth), is therefore very desirable and is favored by the compounds according to the invention, which are adjacent to the absorber materials.

To achieve the optimum of both donor molecule orientation and morphology, the template-donor molecule interaction should be both strong enough to achieve face-on stacking and weak enough to avoid film roughness. In particular, the charge transport is to be improved perpendicular to the substrate, which causes an increase in the fill factor, or allows higher layer thicknesses with constant filling factor, so that thus more photocurrent is generated.

The inventive use of the compounds with the above substituent patterns form layers of flat-lying molecules (face-on, horizontal orientation) via strong hydrogen bonds and simultaneously attenuated pi-stacking-interaction, in contrast to phthalocyanines, hexabenzocorons and other polyaromatic and heteroaromatic fused slice molecules, in which the strong pi-pi-stacking-interaction of the molecules with each other they are coplanar and vertically upright (edge-on, vertical orientation).

The present inventors show by way of example a template layer comprising ellagic acid, which is one of the compounds according to the invention according to one of the above-mentioned structures, and which was applied before the absorber layer on the layer stack that solar cells with template layer have a higher efficiency than adequate solar cells without a template layer.

Furthermore, the present inventors surprisingly found that solar cells even with a thin template layer have a higher efficiency than identical solar cells without template layer and at the same time the life of the solar cell can be increased.

The invention and the embodiments will be described with drawings.

The technical problem is solved by the use of polyphenols and/or polyaminoaromatics or heteroaromatics, which are adjacent to small molecule based absorber materials, in organic optoelectronic devices to achieve better face on growth of the absorber materials.

Analogously, the technical problem is solved by a layer comprising polyphenols and/or polyamino-aromatics or heteroaromatics, wherein the layer with these compounds absorber layers with absorber materials based on smaller molecules border and better face-on growth allow absorber materials.

The technical problem is accordingly solved with optoelectronic components which comprise compounds of structure (I) which adjoin absorber materials based on small molecules:

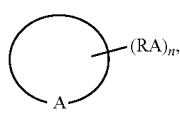

structure (I)

wherein A symbolizes the residue of a cycle, that all or partially, forms a carbocyclic or heterocyclic aromatic, monocyclic or polycyclic system, Wherein this cycle comprises at least n>1 radicals RA, and these radicals RA are each independently selected from hydroxy and amino groups.

In one embodiment, the organic optoelectronic components with at least one of the proposed compounds according to the invention are adjacent to absorber materials based on small molecules, preferably adjacent to absorber materials based on A-D-A (acceptor-donor-acceptor) or D-A-D (donor-acceptor-donor). The photoactive layer which comprise the absorber materials may be
  a combination of single layers, wherein one layer containing a donor material is arranged adjacent to at least one layer with an absorber material, or
  may be executed as bulk heterojunction layers,
  or a combination of both.

In one embodiment, the optoelectronic component comprises a separate layer, referred to as a template layer, comprising the compounds according to the invention, wherein this template layer being processed in front of the adjacent photoactive layer (absorber layer), which comprising at least one absorber material based on small molecules.

In a further embodiment, the inventive used compounds are added as an additive to at least one absorbing layer.

In another embodiment, within a tandem or multilayer element, only one cell may be include one of the proposed ones compounds, or the same and/or different of these proposed compounds may be used in at least two cells.

In a combination of the above embodiments, it is possible for a subcell to also include multiple template layers within its photoactive layer stack, wherein the template layers may comprise the same or different materials. In an adequate embodiment, the template layers can be understood as a partially or completely additive (addition) to the absorber layer in the optoelectronic component.

According to the invention, preference is given to using cyclic compounds whose radicals RA=hydroxyl groups in the organic optoelectronic components.

The inventors understand the inventively used compounds preferably compounds of general structure II.

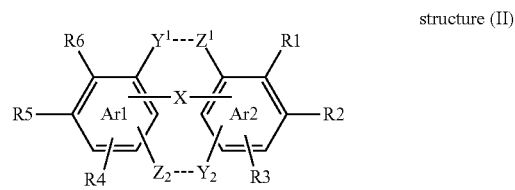

structure (II)

the two or more connected aromatic or heteroaromatic rings (Ar1, Ar2) are preferably benzene rings, each having at least two hydroxyl groups and/or amino groups,
wherein the aromatic rings (Ar1, Ar2) both by a single bond (—X—) linked, as well as can be directly fused,
R1 to R6 are selected from H, OH, NH2;
Y1 is selected from CH, CH2, CO;
Y2 is selected from CH, CH2, CO, H;
Z1 is selected from CH, CH2, CO, O, NH;
Z2 is selected from CH, CH2, CO, O, NH, H;
wherein the links Y1 . . . Z1 and/or Y2 . . . Z2 can be both covalent and non-covalent, in the first (covalent) case with Y1 . . . Z1 and/or Y2 . . . Z2 can also form a substituted aromatic or heteroaromatic mono-, di or trihydroxy compound.

In the fused structures, preferably substituted naphthalene derivatives (II.1) and anthracene derivatives (II.2) are formed, which may be both bridged and unbridged. If YI, ZI or RI with I>1 are not explicitly assigned to a position, the substituents can be arranged at arbitrary positions in the assigned ring:

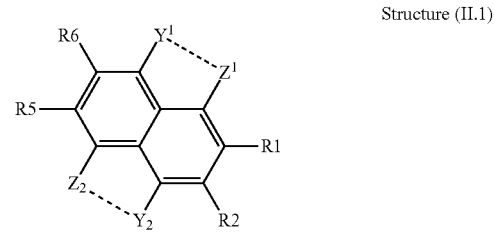

Structure (II.1)

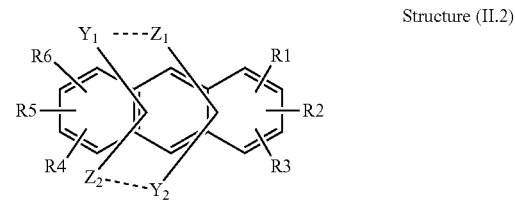

Structure (II.2)

wherein R1 to R6 are selected from H, OH, NH2;
Y1 is selected from CH, CH2, CO;
Y2 is selected from CH, CH2, CO, H;
Z1 is selected from CH, CH2, CO, O, NH;
Z2 is selected from CH, CH2, CO, O, NH, H;
wherein the links Y1 . . . Z1 and/or Y2 . . . Z2 can be both covalent and non-covalent, within the first case, Y1 ... Z1 and/or Y2 ... Z2 can also form a substituted aromatic or heteroaromatic mono-, di-trihydroxy compound.

The substitutes of the aromatic rings (Ar1 and Ar2) according to structure (II), which are linked by means of a single bond (—X—), can be independent by one or two double bonds with the formation of a phenanthrene or pyrene, by one or more fused aromatic or heteroaromatic rings to form a triphenylene or dibenzopyrene, by alkyl groups having one to three carbon atoms, by aryloxy or arylamino groups by alkoxy groups to form pyrans, by carbonyl, carboxy or carbamoyl groups with formation of ketones, quinones, anthraquinones (II.3), lactones and lactams.

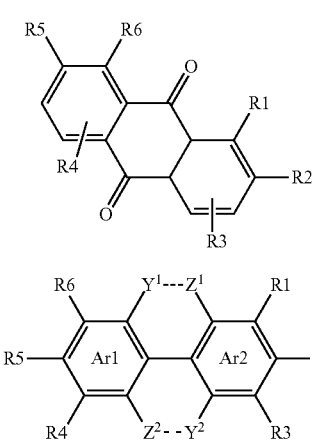

Structure (II.3)

Structure (II.4)

Wherein Ar1 and Ar2 are two or more connected aromatic or heteroaromatic rings (Ar 1, Ar 2), preferably benzene rings, which each comprise at least two hydroxyl groups and/or amino groups, R1 to R6 are selected from H, OH, NH2;

Y1 is selected from CH, CH2, CO;

Y2 is selected from CH, CH2, CO, H;

Z1 is selected from CH, CH2, CO, O, NH;

Z2 is selected from CH, CH2, CO, O, NH, H;

wherein the links Y1 ... Z1 and/or Y2 ... Z2 can be both covalent and non-covalent, within the first case, Y1 ... Z1 and/or Y2 ... Z2 can also form a substituted aromatic or heteroaromatic mono-, di-trihydroxy compound.

Among preferred compounds based on polyphenols according to the invention are understood in particular compounds of the general Structure (II.4).

The compounds based on polyamino derivatives used according to the invention are understood in particular as meaning the following compounds:

Polyamino aromatics or heteroaromatics described by the general structure (I) wherein A symbolizes the remainder of a cycle which is wholly or partly a carbocyclic or heterocyclic aromatic, monocyclic or forms polycyclic system, and wherein this cycle comprises at least 2 residues based on amino groups.

Examples of polyphenols used according to the invention are shown in Table 1.

TABLE 1

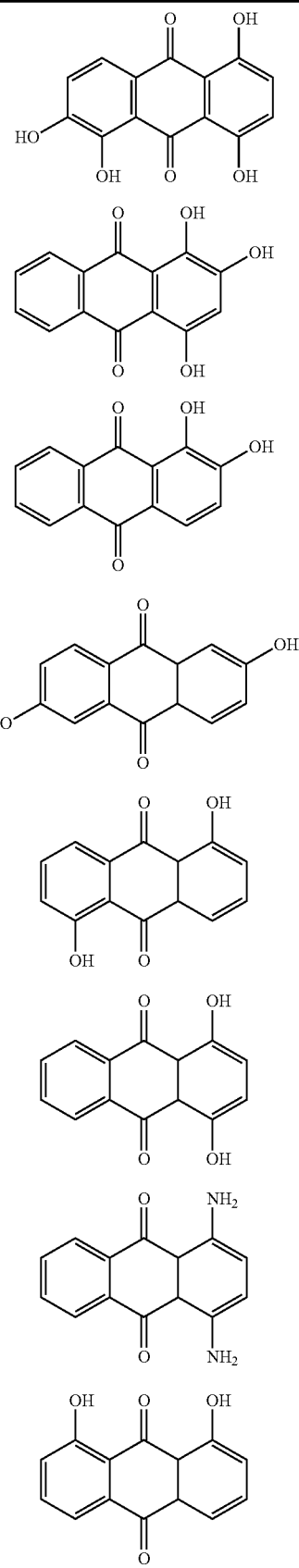

TABLE 1-continued
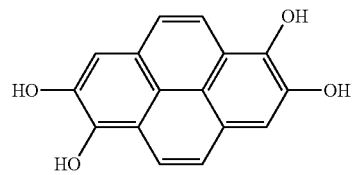 [SMILES: Oc1cc2ccc3c(O)c(O)cc4ccc(c1O)c2c43]
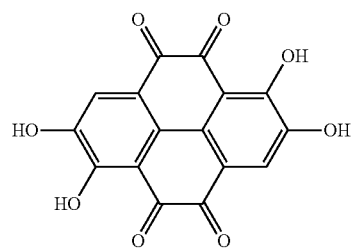 [SMILES: O=c1c(=O)c2c(O)c(O)cc3c2-c2c1cc(O)c(O)c2c(=O)c3=O]
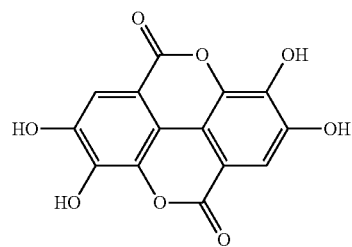 [SMILES: O=c1oc2c(O)c(O)cc3c(=O)oc4c(O)c(O)cc1c4c23]
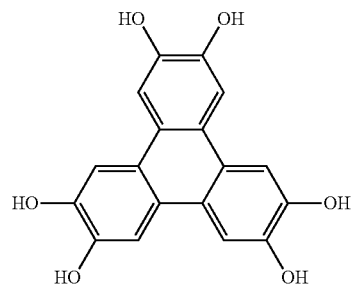 [SMILES: Oc1cc2c3cc(O)c(O)cc3c3cc(O)c(O)cc3c2cc1O]
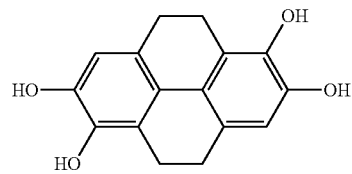 [SMILES: Oc1cc2c3c(c1O)CCc1cc(O)c(O)c(c1-3)CC2]
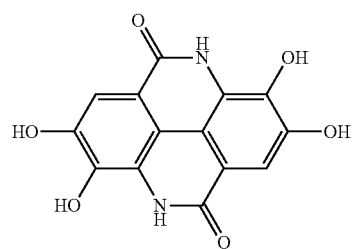 [SMILES: O=c1[nH]c2c(O)c(O)cc3c(=O)[nH]c4c(O)c(O)cc1c4c23]
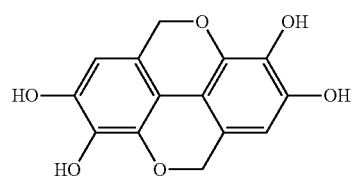 [SMILES: Oc1cc2c3c(c1O)OCc1cc(O)c(O)c(c1-3)OC2]
TABLE 1-continued
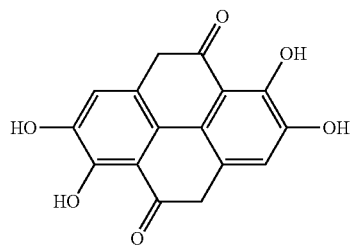 [SMILES: O=C1Cc2cc(O)c(O)c3c2-c2c(cc(O)c(O)c21)CC3=O]
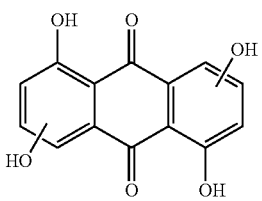
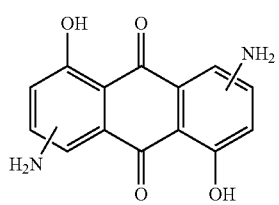
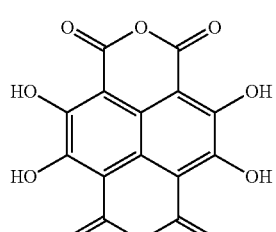
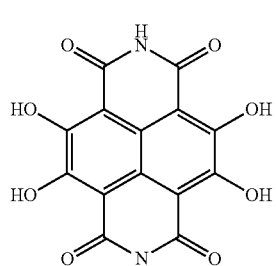
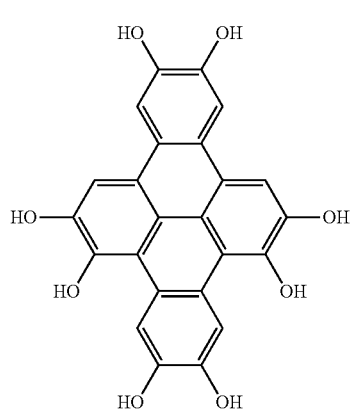 [SMILES: Oc1cc2c(cc1O)c1cc(O)c(O)c3c4cc(O)c(O)cc4c4c(O)c(O)cc2c4c13]
(In the two lower left-hand compounds, the hydroxy or amino groups, each of which is appended with a line extending into the ring, can be independently at each of the sites without be added predetermined substituent.)

As further compounds usable according to the invention in accordance with Structure (I) the following compounds are given:

TABLE 2

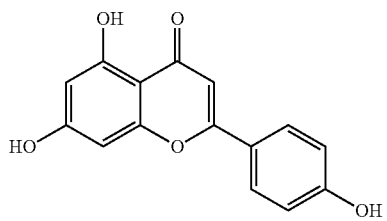 [SMILES: O=c1cc(-c2ccc(O)cc2)oc2cc(O)cc(O)c12]

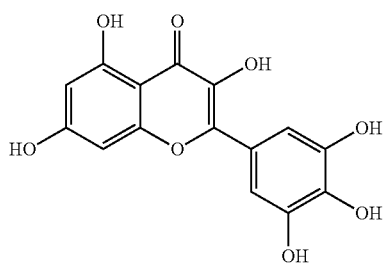 [SMILES: O=c1c(O)c(-c2cc(O)c(O)c(O)c2)oc2cc(O)cc(O)c12]

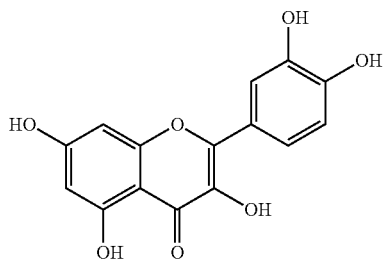 [SMILES: O=c1c(O)c(-c2ccc(O)c(O)c2)oc2cc(O)cc(O)c12]

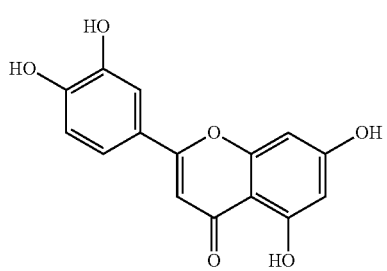 [SMILES: O=c1cc(-c2ccc(O)c(O)c2)oc2cc(O)cc(O)c12]

Most of the compounds named in the two tables are known and commercially available.

The inventors were able to surprisingly find that the following natural substances also appear to be suitable as compounds for the solution of the technical problem, because they likewise correspondingly favor an adequate arrangement:

TABLE 3

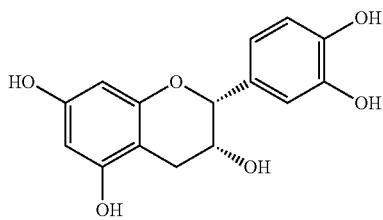

Epicatechin
(from green tea and cocoa)

14

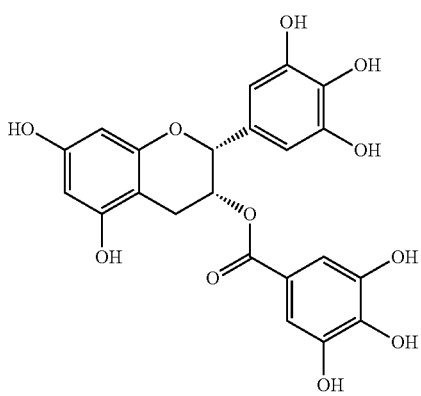

Epigallocatechingallat
(from green tea)

15

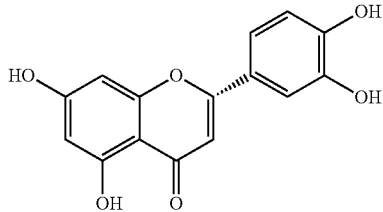

Luteolin

16

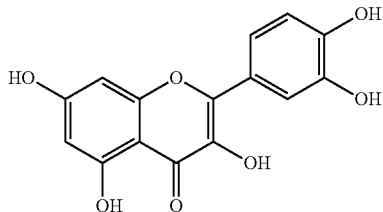

Quercetin
(apples and onions)

17

Figure 11:
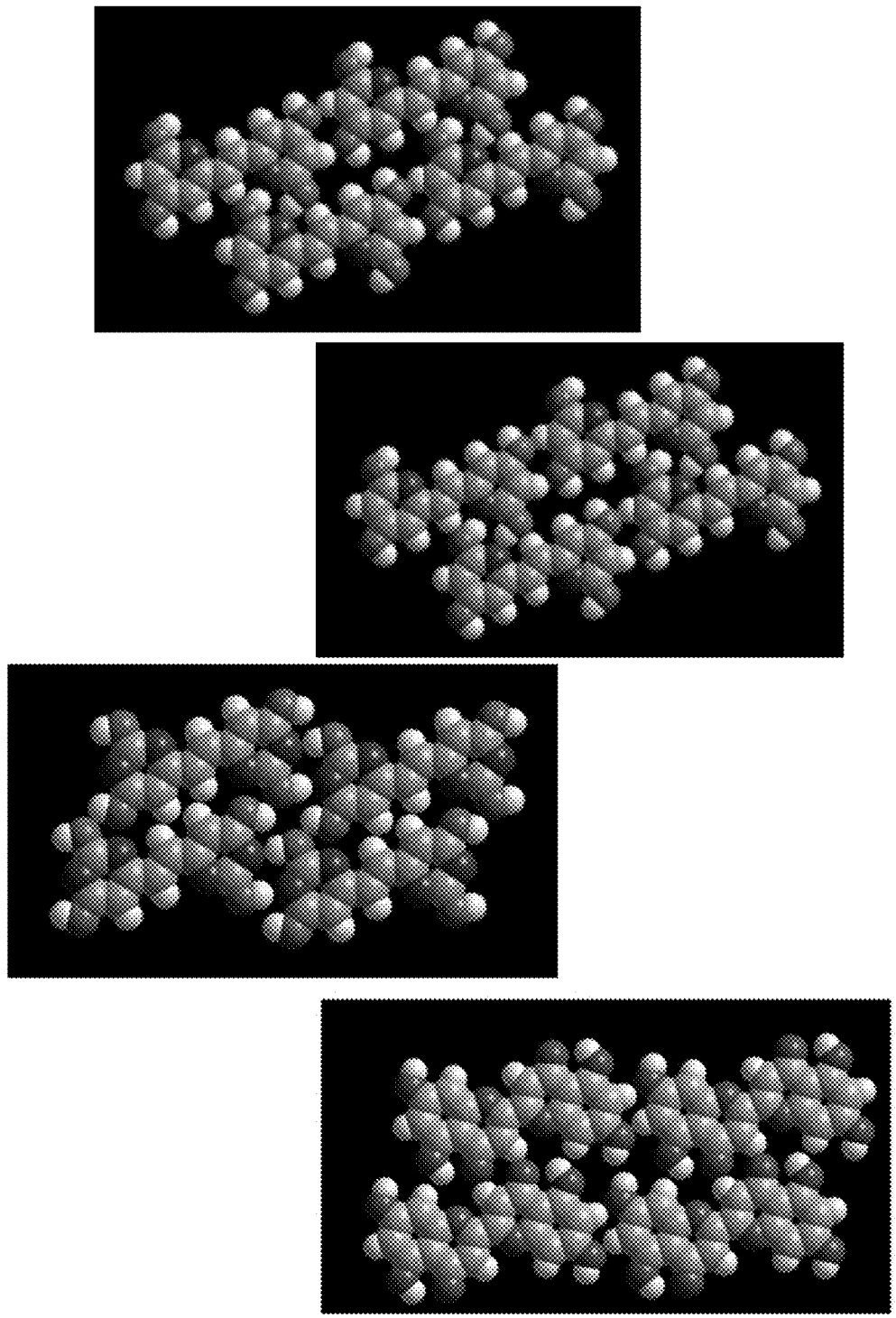
FIG. 11 is a 2D arrangements of possible further materials in one template layer.

TABLE 3-continued
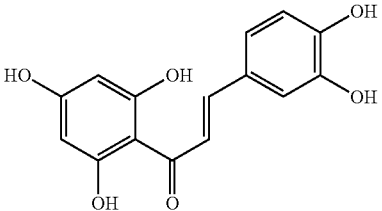
Naringenin
(citrus fruits)
18
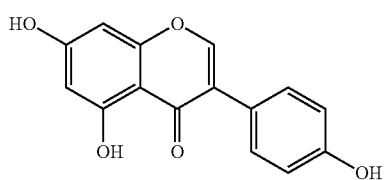
Genestein
(from soy)
19
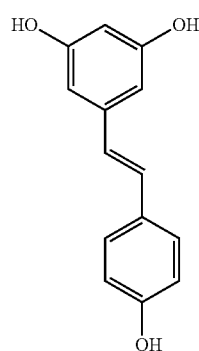
Reveratrol
(from red wine)
20
Furthermore, the following materials are proposed, which are characterized by a combination of several OH groups and several N—H bridges per molecule. FIG. 11 illustrates the 2D arrangement of some materials in the following table 4.
TABLE 4
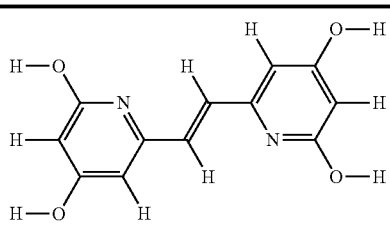
TABLE 4-continued
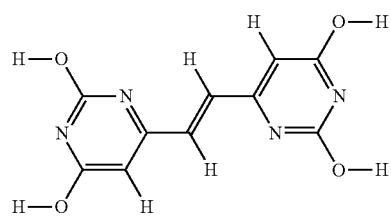 [SMILES: Oc1cc(/C=C/c2cc(O)nc(O)n2)nc(O)n1]
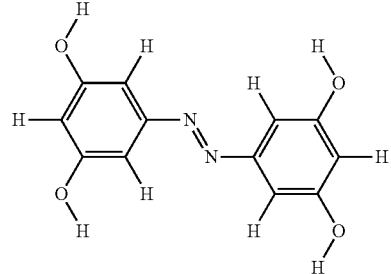 [SMILES: Oc1cc(O)cc(/N=N/c2cc(O)cc(O)c2)c1]
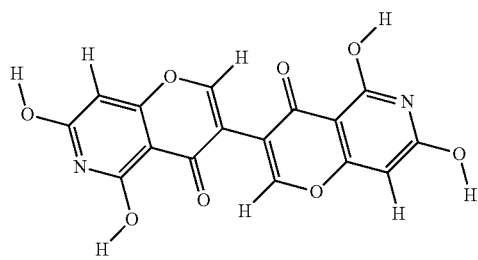 [SMILES: O=c1c(-c2coc3cc(O)nc(O)c3c2=O)coc2cc(O)nc(O)c12]
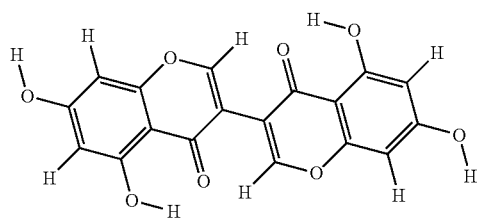 [SMILES: O=c1c(-c2coc3cc(O)cc(O)c3c2=O)coc2cc(O)cc(O)c12]
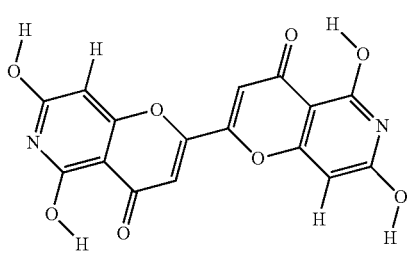 [SMILES: O=c1cc(-c2cc(=O)c3c(O)nc(O)cc3o2)oc2cc(O)nc(O)c12]
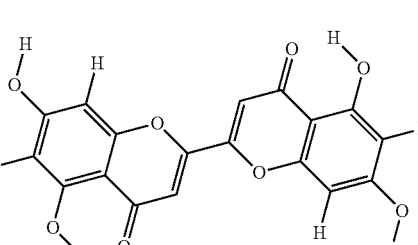

TABLE 4-continued

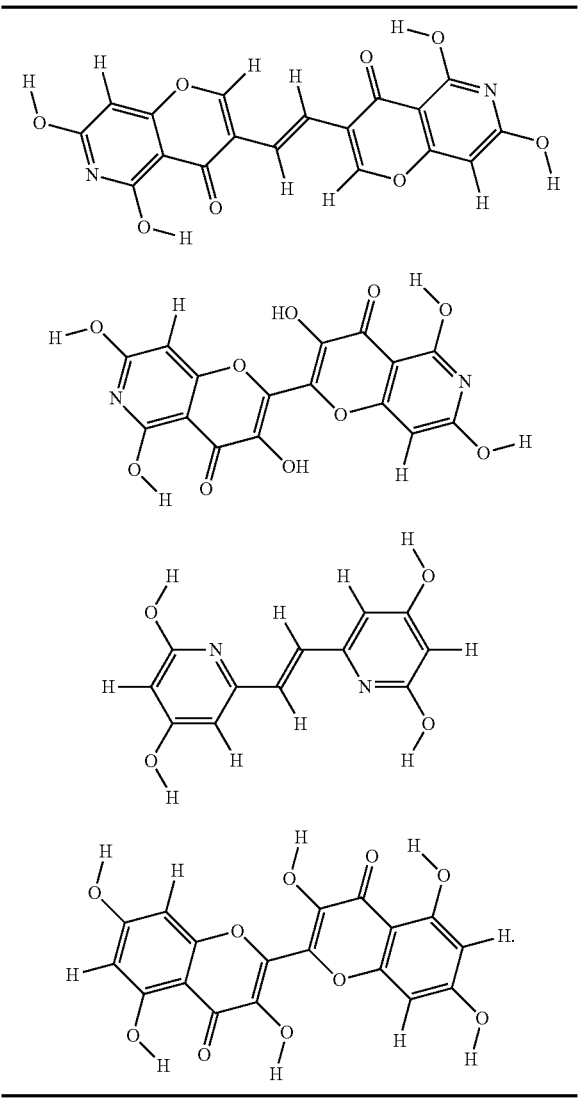

Furthermore, the syntheses of organic optoelectronic components with compounds according to one of the structures (I), (II), (II.1), (II.2), (II.3) or (II.4) or the above tables. The skilled person are known the steps for the syntheses of organic optoelectronic components. Therefore, according to the invention, the additional step in which, before applying at least one absorber layer, a template layer, comprising at least one of the compound of the invention, on the previously processed layer stack, is applied and then only the absorber layer is applied. This step can be repeated in further absorber layers within a layer stack of the optoelectronic component, both within only one cell and in different cells, wherein different or the same materials can be used in the template layers.

Alternatively, at least one compound according to the invention can also be applied together with one or more absorber layers.

The application of the compounds of the invention can, for example
By co-evaporation with at least one absorber material, when used as additives,
by evaporation before processing the absorber layer, when using as a template layer, or
by application from a solution.

A template layer with at least one of the compounds can be made either in one cell of a tandem or multiple cell or in several cells of a tandem or multiple cell prior to applying the absorber material in that cell. It can be applied in the individual cells, the same template materials or different template materials before applying the absorber materials of this cell during the construction of the layer stack.

In another embodiment, the organic optoelectronic device within comprises a cell of a single, tandem or multiple cell multiple layers with the same or different compounds of the invention.

Furthermore, according to the invention, is the use of the compounds according to the structures (I), (II), (II.1), (11.2), (11.3) or (11.4), in organic optoelectronic devices, wherein this material adjoins on at least one absorber material of a photoactive layer.

Preferred is the use of compounds according to the structure (II.4), or compounds according to Table 1, particularly preferred is the use of ellagic acid.

In one embodiment, at least one of the aforementioned materials is used in a template layer that directly adjoins a subsequently applied absorber layer.

Particularly preferred is the use of only one inventive material in a template layer adjacent to a subsequently applied absorber layer.

Examples

In the following exemplary embodiments, the functional suitability of the compounds proposed according to the invention is shown by the example of ellagic acid.

FIG. 1 shows the result of grazing incidence X-ray diffractometry (GIXRD) of a 5 nm thick polyphenol-containing layer. The layers were vacuum deposited on a SiO wafer coated with 10 nm C60. The deposition of the layer used in FIG. 1 as a template was carried out at room temperature of the substrate. The three Bragg reflections at 2θ of 10.9°, 18.2° and 20.7° are assigned to the cubic face-centered phase (fcc) of the C60 sublayer [Elschner, C. et al.: Determining the C60 molecular arrangement in thin films by means of X-ray diffraction. Journal of Applied Crystallography, 44 (5): 983-990, 2011].

The reflection at 27.6° is assigned to the template layer and indicates that this nanocrystal grows in pi-pi stacks on C60. The distance between the crystal planes is 3.23 Å. Thus, the template molecules are aligned parallel to the substrate, the pi-pi stacking direction is perpendicular to the substrate.

Figure 2:
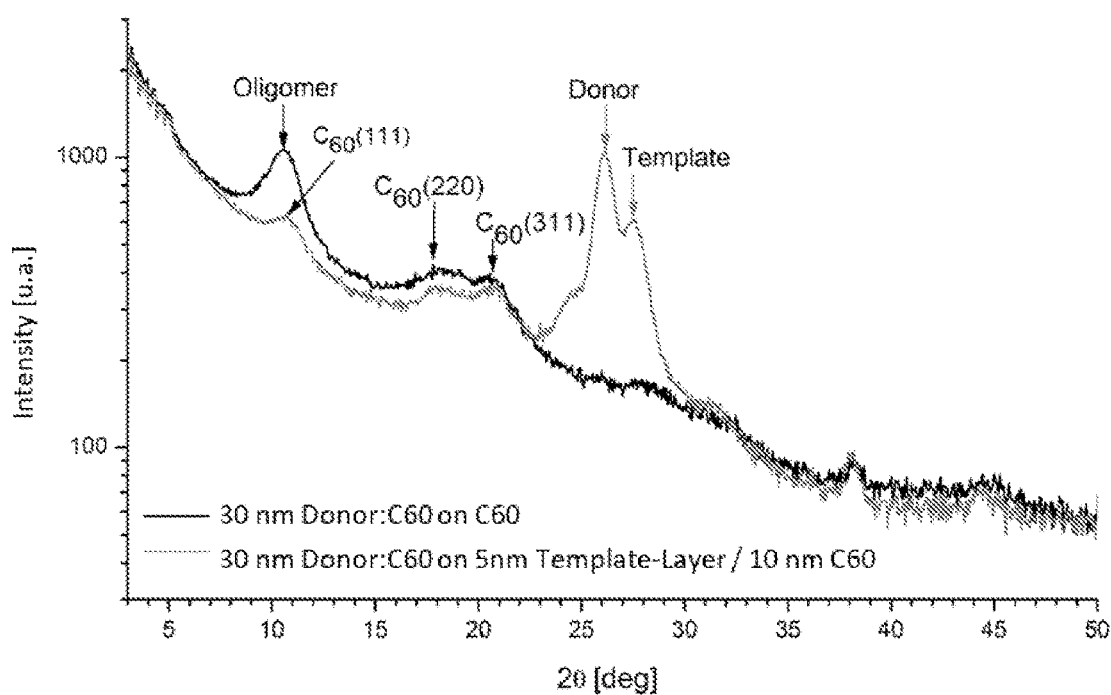
FIGS. 2, 3, 4 are X-ray diffractograms of samples with and without template layer.
Figure 10:
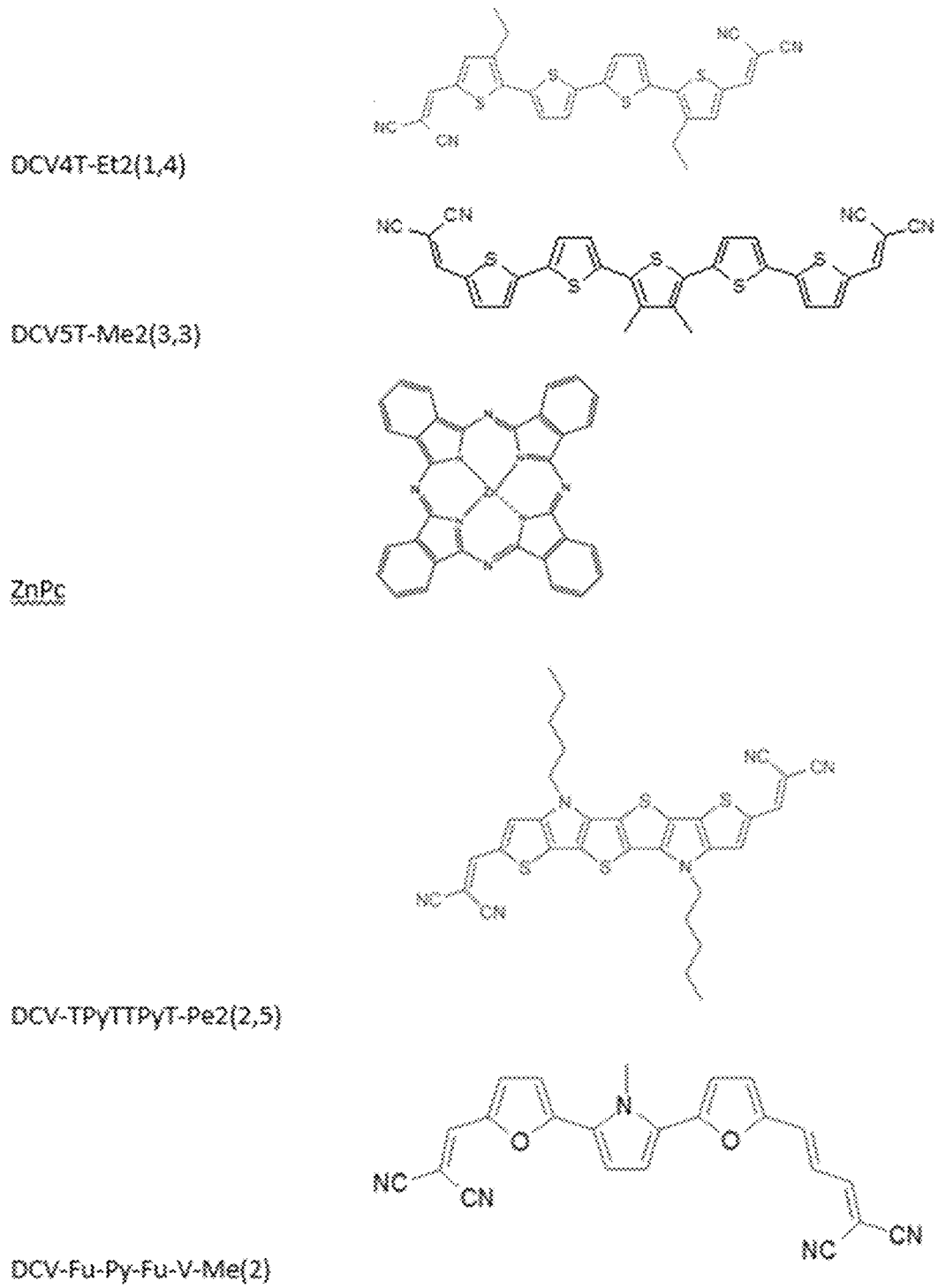
FIG. 10 is a list of in the embodiments mentioned absorber material molecules.

FIG. 2 shows the results of GIXRD measurements on a 30 nm donor: C60 mixed layer, with the A-D-A oligomer DCV4T-Et2, cf. FIG. 10 as donor deposited on 10 nm C60/Si substrate with and without 5 nm template layer. The donor: C60 mixed layer was deposited at a substrate temperature of 40° C., the mixing ratio is 2:1 mass. This mixed layer grows on C60 nanocrystalline.

The reflex at 2Θ=10.8° was assigned to the donor and corresponds to a distance between the crystal planes of 8.2 Å. This value indicates to obliquely orientated donor molecules, i.e. are oriented edge-on to the substrate [Guskova, 0.: Light absorption in organic solar cells: The importance of oriented molecules, J. Phys. Chem. C, 2013, 117 (33), pp 17285-17293]. Since the (111)-reflex of C60 lies at 2Θ=10.8°, the detected reflex at 10.8° could also represent a superposition of donor and C60-reflexes. The X-ray diffractogram of the mixed layer grown on the template layer shows the characteristic of the templating molecule ellagic acid reflex at 27.6° (see FIG. FIG. 1). The donor reflex at 2Θ=10.8° no longer exists or is significantly attenuated. Instead, diffractogram shows a new strong reflex at 2Θ=26.10 and a shoulder at 24.6°. The crystal plane distance for the reflex at 26.10 corresponds to 3.4 Å and thus indicates a face-on growth or at least of tilted to substrate orientation of donor molecules. The mean size of the donor crystallites was evaluated using the Scherrer equation and is 8.1 nm. Thus, the measurement results prove that the orientation of the donor molecules was influenced by the template layer and the crystallinity of the donor phase in the mixed layer has been improved.

Figure 3:
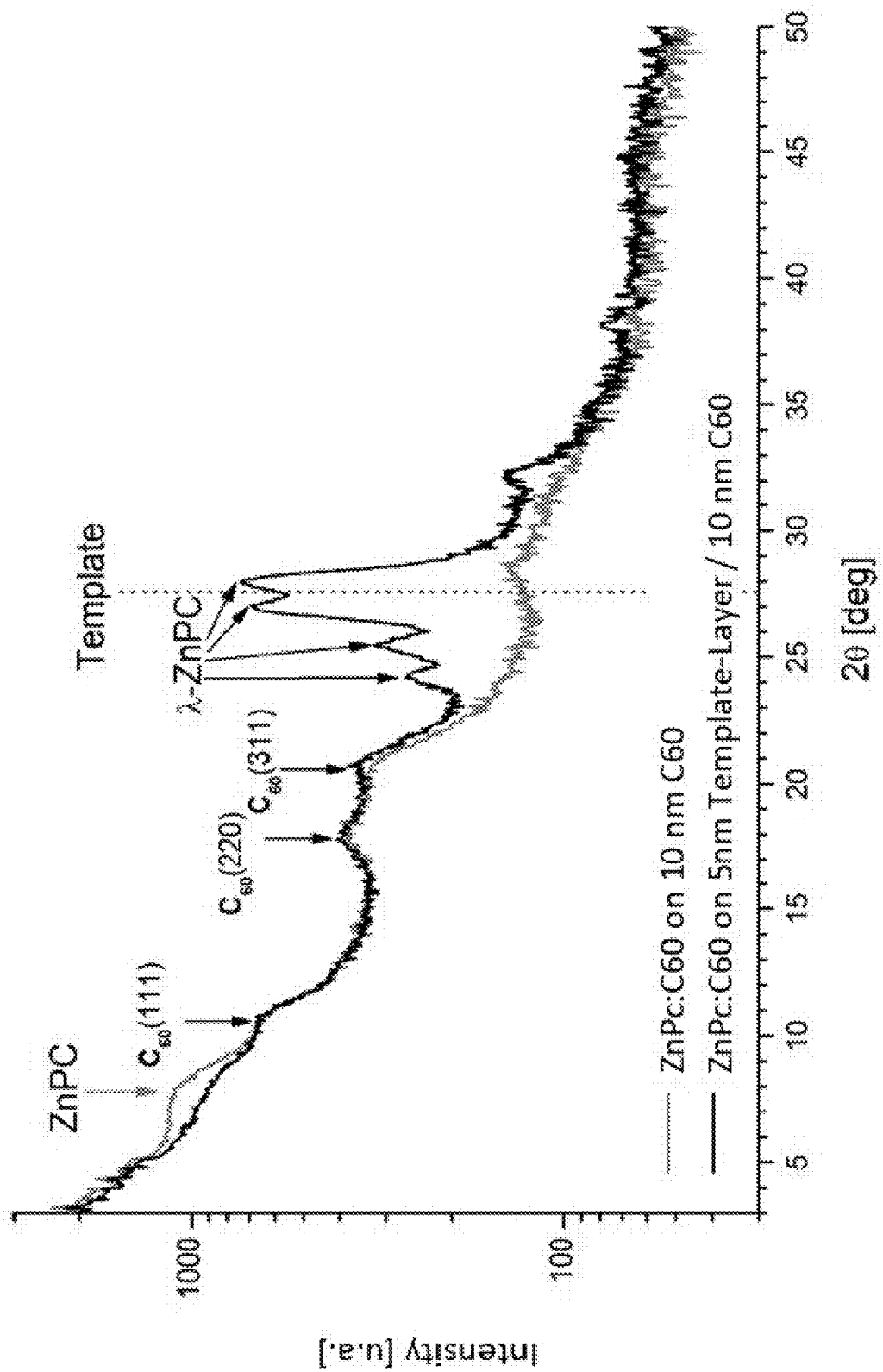

FIG. 3 shows measurement results of GIXRD studies on zinc phthalocyanine (ZnPc) mixed with C60 in a ZnPc:C60 mixed layer grown on 10 nm C60/Si substrate with and without 5 nm template layer. The 30 nm thick mixed layers were deposited on 70° C. heated substrate, the mixing ratio is 1:1. For both samples, the three characteristic reflections of the cubic face-centered (fcc) phase of the C60 sublayer are well visible at 2Θ=10.9°, 18.2°, 20.7°. The ZnPc:C60 mixed layer deposited directly on C60 shows two amorphous ZnPc signals at 2Θ=7.7° and 2Θ=28.6°. The sample deposited on the template layer disappears characteristics at 7.7° and new Bragg reflections at larger 2Θ angles between 24° and 29° occur. In FIG. 3, these are designated by λ ZnPc. The assignment of the reflexes was based on the publication of [Schünemann, C. et al.: Evaluation and Control of the Orientation of Small Molecules for Strongly Absorbing Thin Films. The Journal of Physical Chemistry C 2013, 117, 11600-11609]. The reflections labeled λ correspond to flat-lying ZnPc molecules (face-on growth) on the substrate. The calculated distances between parallel crystal planes are in the range of 3.2 Å to 3.7 Å.

Accordingly, the thin template layer changes the orientation from standing to face-on and improving the orientation crystallinity of ZnPc molecules.

Figure 4:
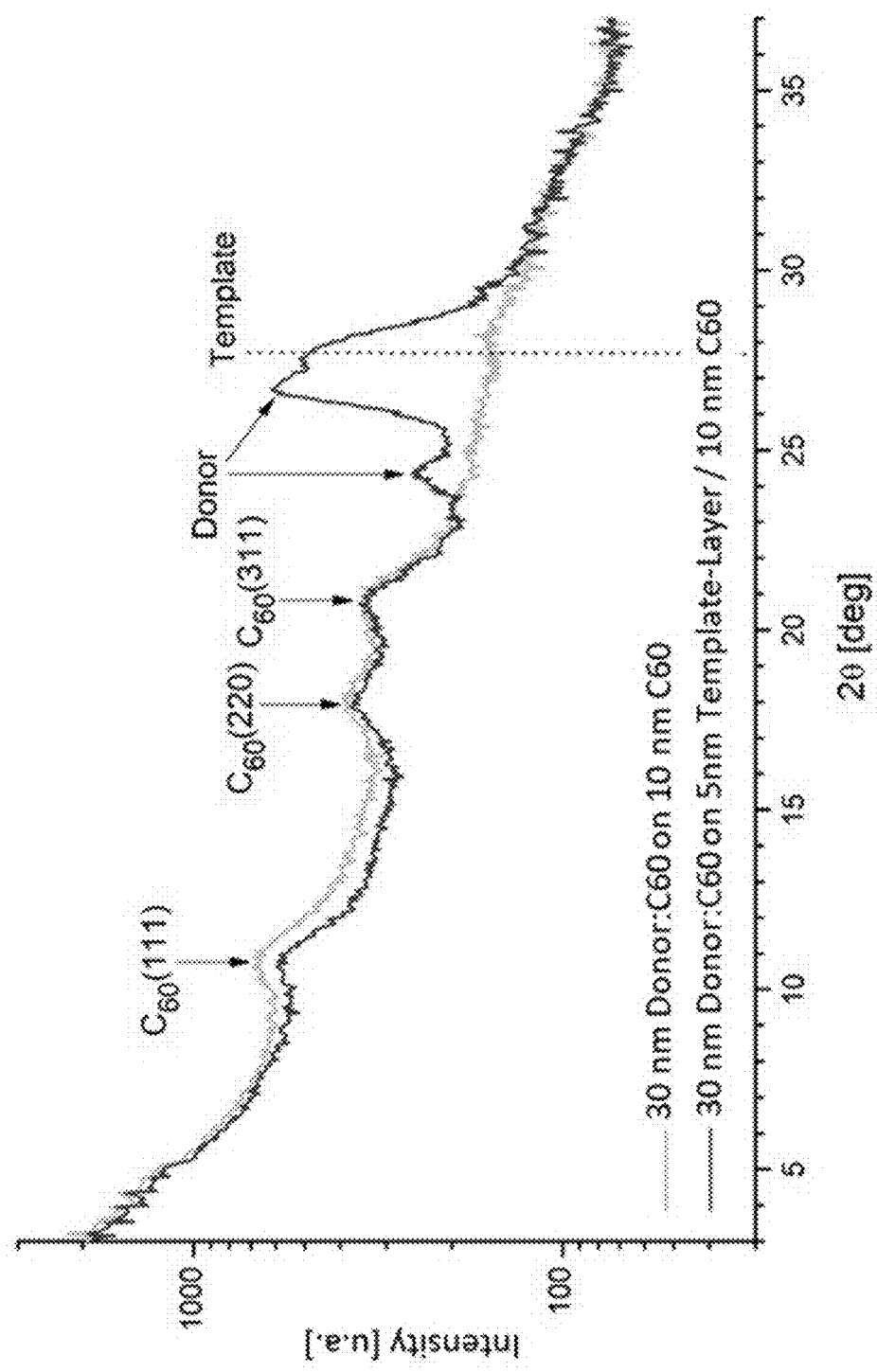

FIG. 4 shows results of GIXRD measurements on donor:C60 mixed layers, with DCV5T-Me2 (3,3) as a donor, deposited on 10 nm C60 with and without template layer. The 30 nm thick mixed layers were deposited on 80° C. heated substrate, the mixing ratio is 2:1. The X-ray diffraction pattern shows the characteristic peaks of the C60 fcc phase for both donor: C60 mixed layers. The donor in the mixed layer, deposited directly on C60 grows amorphous. In contrast, reflections in the 2Θ-region between 24° and 30° appear on the template layer. These are assigned to the donor phase in the mixed layer and the template layer.

Accordingly, the donor on the template layer grows crystalline. The reflections between 24° and 30° correspond to Bragg distances of 3.7 Å and 3.4 Å.

These values indicate shallow-lying (face-on) or at least strongly to the substrate inclined donor molecules.

Figure 5:
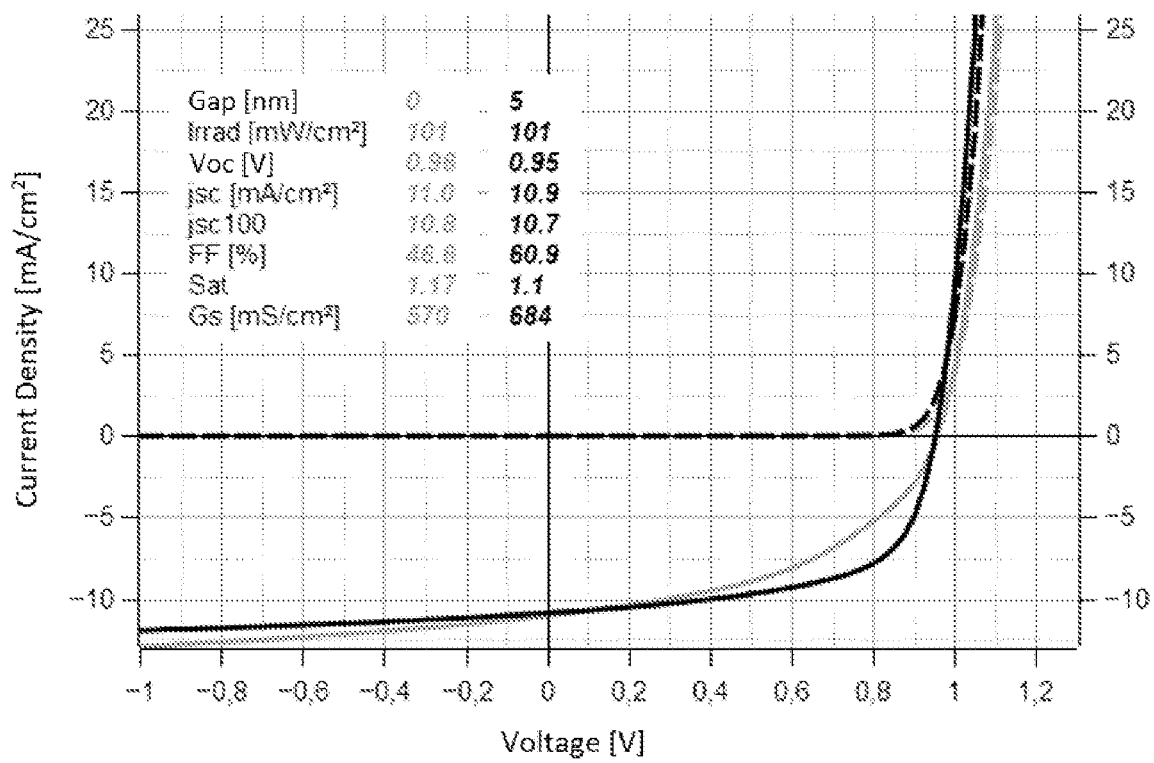
FIGS. 5, 6, 7, 8 are current-voltage curves of solar cells with and without template layer.

FIG. 5 shows the measurement results of solar cells containing a photoactive layer of donor:C60 (donor=DCV4T-Et2). The photoactive layer has a thickness of 30 nm. The deposition of the photoactive layer was carried out at a substrate temperature of 40° C. The mixing ratio between donor and C60 is 2:1. The gray curve shows the current-voltage characteristic of a device in which the photoactive layer is directly on C60 was deposited and the black curve shows the current-voltage characteristic of a device with photoactive layer deposited on a 5 nm thick template layer. For the cell with the template layer, an increase of the fill factor by 13.6% is observed (from 45.2% to 58.8%). This is in accordance with the results of the GIXRD measurement (FIG. 2) on the improved attributed crystallinity of the photoactive layer. The template layer thus leads to a significantly improved solar cell.

Figure 6:
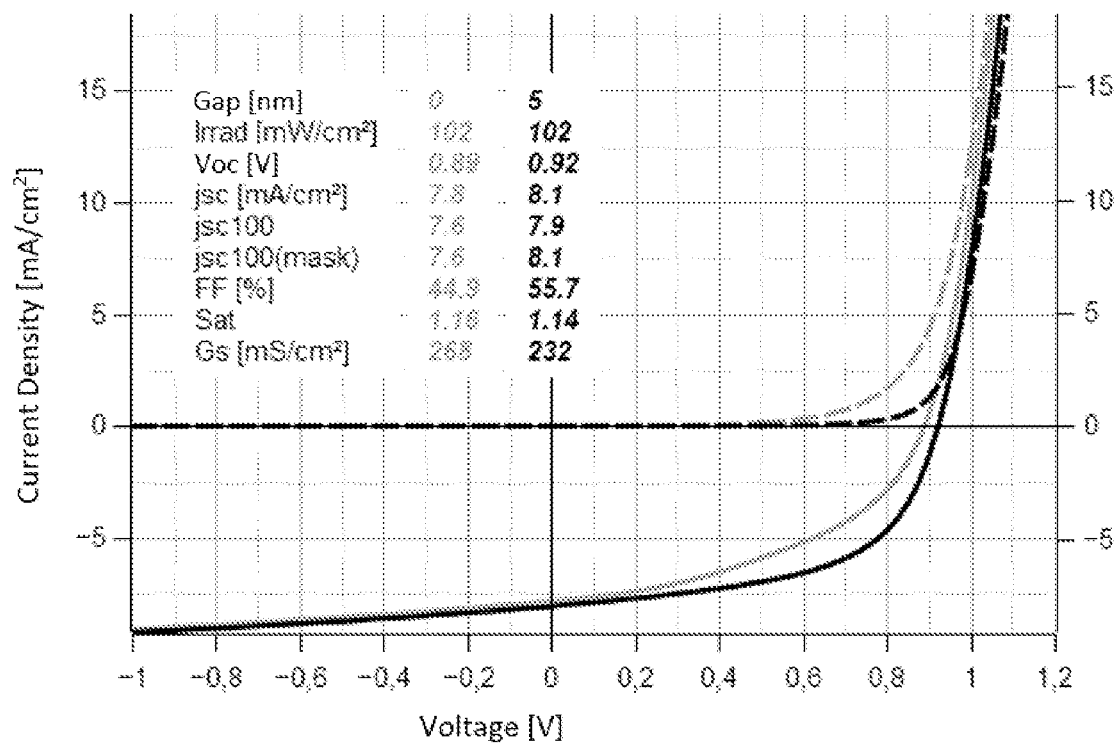

FIG. 6 shows the measurement results of two solar cells with a photoactive layer of donor:C60 (DCV4T-Et2:C60). The photoactive layer has a thickness of 30 nm. Their deposition was carried out at a substrate temperature of 70° C. The gray characteristic shows the current-voltage characteristic of the device in which the donor: C60 layer was deposited directly on C60 and the black characteristic shows the current-voltage characteristic of a device with donor:C60 layer deposited on a 5 nm thick template layer. the Fill factor of the solar cell with the template layer is 55.7%, compared to the solar cell without template layer having a lower fill factor of 44.9%.

The increase in the fill factor is due to the improved close arrangement of the donor phase in the photoactive layer, grown on the template layer. With Template (material) also increases Voc, only Jsc sinks slightly. Overall, the template improves the cell efficiency PCE=Voc*jsc*FF.

Figure 7:
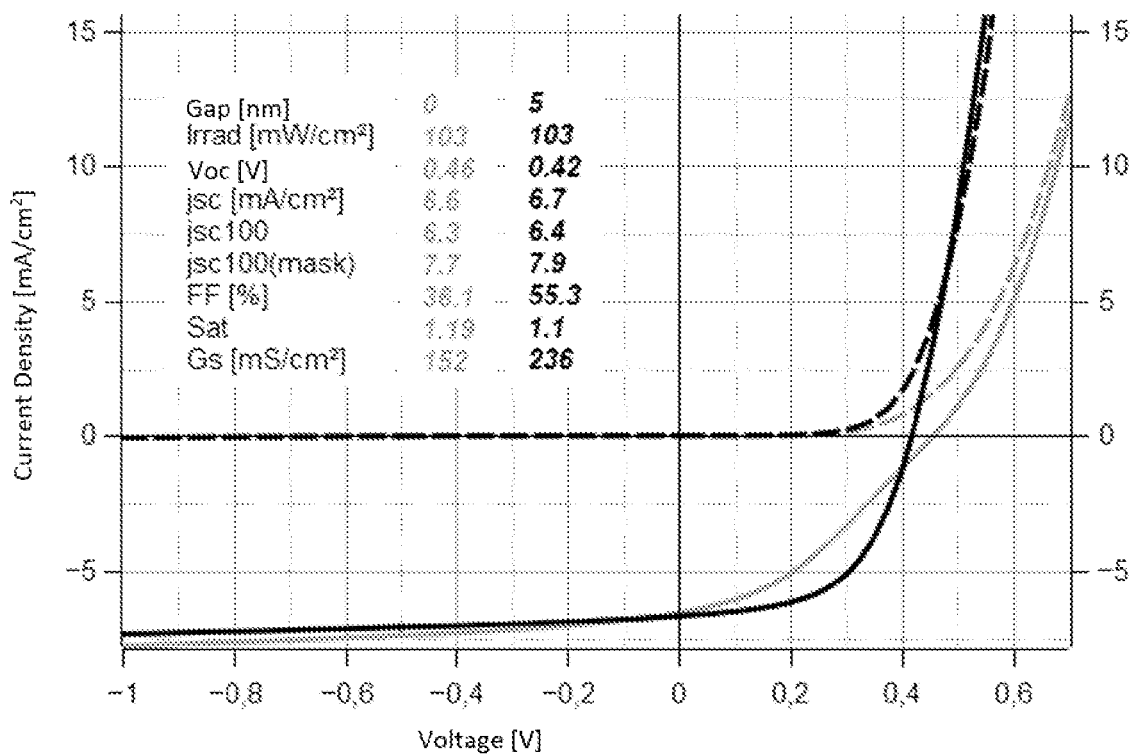

FIG. 7 shows the measurement results of two solar cells, which as photoactive layer ZnPc:C60 included. The photoactive layer has a thickness of 30 nm. Their deposition took place at a substrate temperature of 70° C. The gray curve represents the current-voltage characteristic of the device in which the ZnPc: C60 layer was deposited directly on C60, whereas the black curve shows the current-voltage characteristic of a device with ZnPc:C60 layer deposited on a 5 nm thick template layer. The solar cell without template layer has a fill factor of 36.10%, in contrast, the cell with template layer has a much better fill factor of 55.3%. According to the GIXRD data (see FIG. 3), the improved fill factor is due to the crystallinity of the ZnPc phase in the blend layer caused by the template layer.

Although Voc and jsc decrease slightly, overall efficiency PCE=Voc*jsc*FF improves with the template layer as a whole.

Figure 8:
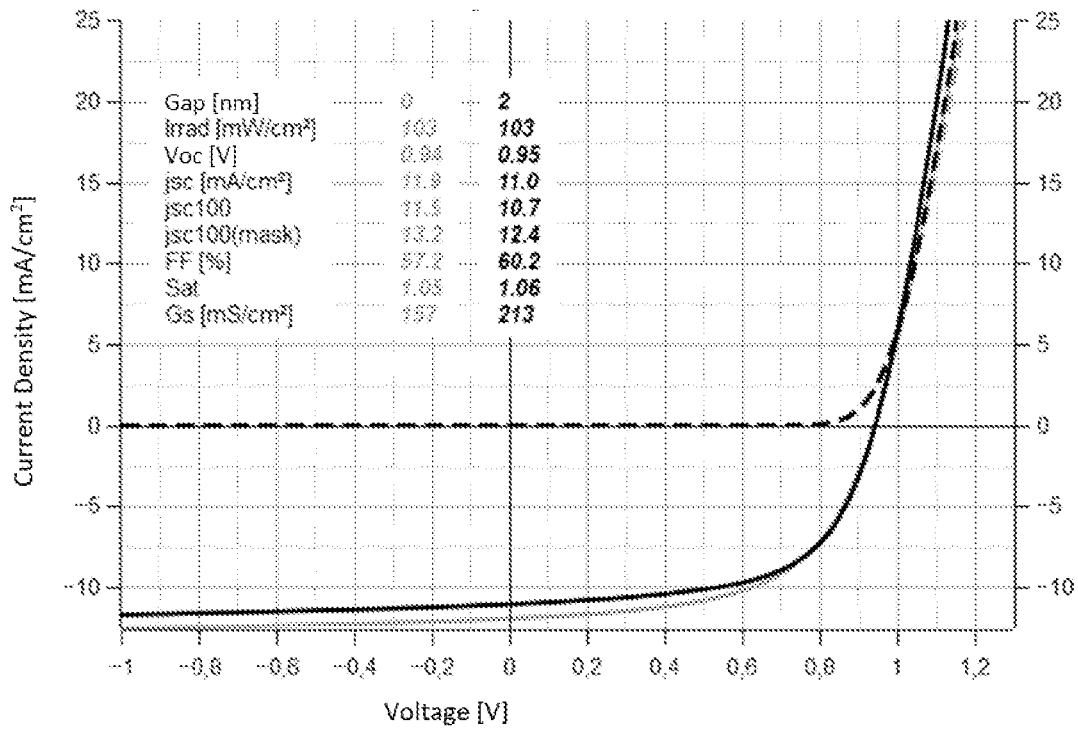

In FIG. 8, the measurement results of solar cells, comprising a photoactive layer from donor:C60 (donor=DCV-TPyTTPyT-Pe2 (2,5)) are shown. The photoactive layer has a thickness of 30 nm. The deposition of the photoactive layer was carried out at a substrate temperature of 70° C. The mixing ratio between donor and C60 is 2:1. The gray curve in FIG. 8 shows the current-voltage characteristic of a device in which the photoactive layer was deposited directly on C60, and the black curve shows the current-voltage characteristic of a device with a photoactive layer deposited on a 2 nm-thick template layer. For the cell with the template layer there the filling factor is increased compared to the cell without template layer from 57.2% to 60.2%.

This is due to an improved degree of crystallization of the donor phase in the mixed layer due to the interaction with the crystalline template layer. The overall efficiency PCE=Voc*jsc*FF, however, remains almost unchanged, since the sample with template layer shows a lower current value.

Figure 9:
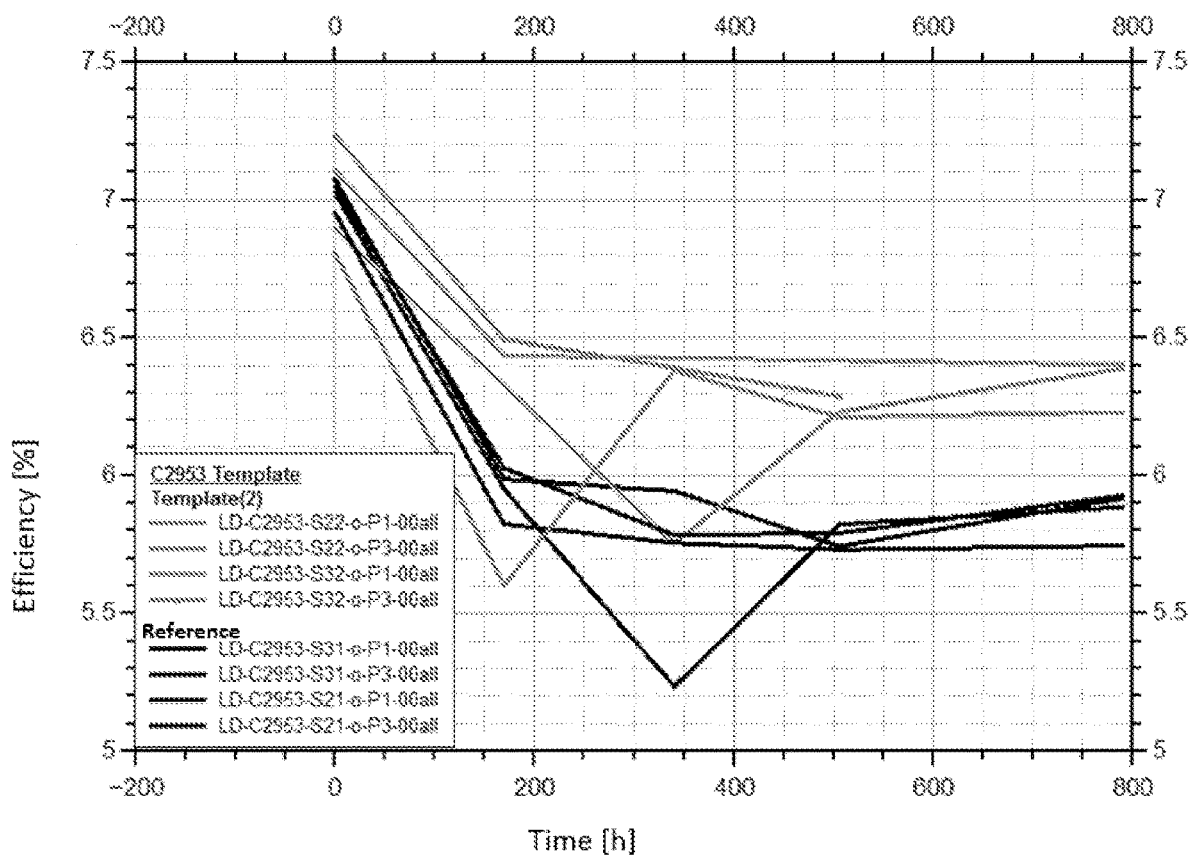
FIG. 9 is an accelerated life measurement of solar cells with and without a template layer.

FIG. 9 shows as a surprising finding the results of the lifetime measurements of bulk heterojunction solar cells after 800 hours of accelerated aging in the oven at 85° C. The solar cells contain as photoactive layer donor:C 60 (donor=DCV-Fu-Py-Fu-V-Me (2)) with a mixing ratio of 2:3. They are produced on ITO-coated glass substrate and have the layer sequence ITO/n-C 60/C 60/template (0 or 2 nm)/donor:C60 (30 nm)/hole conductor/p-doped hole conductor/injection layer/cover electrode (A1). The donor:C60 mixed layer was deposited directly on the intrinsic C60 layer or on a template layer.

For both solar cells an initial drop in efficiency was observed, after which the solar cells remain stable. The initial drop is most pronounced at 17% for the reference cells without template layer. By contrast, the decrease for the solar cells with template layer is only about 8%. The efficiency decrease is due to the drop in the fill factor.

Thus, the measurement results indicate a stabilizing effect of the template layer on the life of the solar cells. One possible explanation is the formation of a more stable fill factor by the preferred molecular orientation achieved with the template material.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. An organic optoelectronic component comprising two electrodes and, arranged therebetween, at least one photoactive layer system, the photoactive layer system comprising at least one photoactive layer comprising absorber materials based on small molecules,
wherein:
the photoactive layer is adjacent to a template layer, wherein the template layer and/or the photoactive layer comprises at least one compound according to structure II.1A:

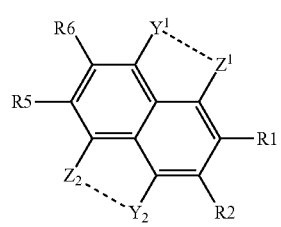

Structure (II.1)

wherein:
R1, R2, R5 and R6 are each independently selected from OH, NH2;
Y1 is selected from the group CH, CH2 or CO,
Y2 is selected from the group CH, CH2, CO or H
Z1 is selected from the group CH, CH2, CO, O, or NH,
Z2 is selected from the group CH, CH2, CO, O, NH, or H, and
wherein the linkages Y1 . . . Z1 and/or Y2 . . . Z2 can be covalent or non-covalent, wherein, in the first (covalent) case Y1 . . . Z1 and/or Y2 . . . Z2 can also form a substituted aromatic or heteroaromatic mono-, di- or trihydroxy compound.

2. The organic optoelectronic component according to claim 1, wherein the absorber materials are based on A-D-A molecules.

3. The organic optoelectronic component according to claim 1, comprising an absorber layer, and wherein the template layer is applied in front of the absorber layer.

4. The organic optoelectronic component according to claim 1, comprising a photoactive layer that is an absorber layer, and wherein the compound according to structure II.1A is added as additives to the absorber layer.

5. The organic optoelectronic component according to claim 1, wherein the organic optoelectronic component comprises a tandem or multiple cell, comprising at least one photoactive layer per cell structure.

6. The organic optoelectronic component according to claim 5, wherein the organic optoelectronic component comprises different layers with identical or different compounds according to claim 1.

7. The organic optoelectronic component according to claim 1, wherein the organic optoelectronic component is an organic solar cell or an organic photodetector and the template layer comprises ellagic acid.

8. The organic optoelectronic component according to claim 1, wherein the at least one compound according to structure II.1A has four ring structures.

9. The organic optoelectronic component according to claim 1, wherein the linkages Y1 . . . Z1 and/or Y2 . . . Z2 are covalent.

10. The organic optoelectronic component according to claim 1, wherein the linkages Y1 . . . Z1 and/or Y2 . . . Z2 form a substituted aromatic or heteroaromatic mono-, di- or trihydroxy compound.

11. The organic optoelectronic component according to claim 1, wherein Y1 is CO, Y2 is CO, Z1 is CO and Z2 is CO.

12. The organic optoelectronic component according to claim 1, wherein the at least one compound according to structure II.1A is:

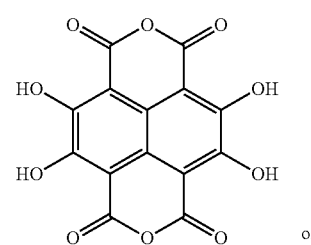

or

-continued
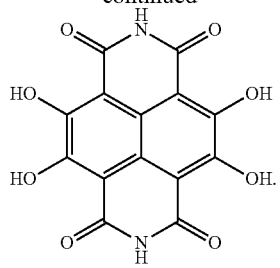
* * * * *